United States Patent [19]

Mukai et al.

[11] Patent Number: 5,462,920
[45] Date of Patent: Oct. 31, 1995

[54] METHOD OF PREPARING OXIDE SUPERCONDUCTING WIRE

[75] Inventors: Hidehito Mukai; Kenichi Sato; Nobuhiro Shibuta, all of Osaka, Japan

[73] Assignee: Sumitomo Electric Industries, Inc., Osaka, Japan

[21] Appl. No.: 295,297

[22] Filed: Aug. 24, 1994

Related U.S. Application Data

[63] Continuation of Ser. No. 854,127, Mar. 19, 1992, Pat. No. 5,369,088.

[30] Foreign Application Priority Data

Mar. 20, 1991 [JP] Japan ................................. 3-56685

[51] Int. Cl.$^6$ ........................ H01L 39/00; H01B 12/00
[52] U.S. Cl. ..................... 505/432; 505/433; 505/430; 505/704; 427/62; 29/599; 174/125; 419/42
[58] Field of Search ....................... 505/432, 433, 505/430, 704; 427/62; 29/599; 174/125.1; 419/42

[56] References Cited

U.S. PATENT DOCUMENTS 5,145,835  9/1992  Takeshita et al. ........................ 505/1
5,206,211  4/1993  Meyer .................................... 505/1

FOREIGN PATENT DOCUMENTS 63-271824  11/1988  Japan.
1-138167   5/1989   Japan.
1-311514   12/1989  Japan.
3-149712   6/1991   Japan.

OTHER PUBLICATIONS

Matsuda et al., "Superconducting Tape-Shaped Wire by $Y_1Ba_2Cu_3O_{7-\delta}$ with Jc≈2000 A/cm$^2$", MRS vol. 99, Nov. 1987, pp. 695–698.

Primary Examiner—Roy V. King
Attorney, Agent, or Firm—Pennie & Edmonds

[57] ABSTRACT

In order to prevent inflation of a metallic coating during heat treatment so that no ununiformity is caused in the critical current density in a method of preparing an oxide superconducting wire which is obtained by heat treating and sintering metal-coated raw material powder for an oxide superconductor, raw material powder (5) for an oxide superconductor is filled up in a metal billet (1), which in turn is degassed and sealed in the degassed state, elongated with application of hydrostatic extrusion, and then heat treated.

5 Claims, 1 Drawing Sheet

METHOD OF PREPARING OXIDE SUPERCONDUCTING WIRE

This is a continuation, of application Ser. No. 07/854,127 filed Mar. 19, 1992, now U.S. Pat. No. 5,369,088.

BACKGROUND OF THE INVENTION

1. Field of the Invention

The present invention relates to a method of preparing an oxide superconducting wire, and more particularly, it relates to a method of preparing an oxide superconducting wire comprising an oxide superconductor which is coated with a metal.

2. Description of the Background Art

A typical method of preparing an oxide superconducting wire comprises the steps of filling up a metal pipe with raw material powder for an oxide superconductor and reducing its diameter by rolling, thereby elongating the same.

When a metal pipe is heat treated in the aforementioned conventional method in order to sinter raw material powder contained therein for forming an oxide superconductor, however, the metal pipe may be inflated due to expansion of gases contained therein. As the result, the critical current density characteristics of the as-obtained oxide superconducting wire may be ununiformalized in relation to its longitudinal direction.

Further, the oxide superconducting wire which can be obtained by the conventional method has been limited to about 100 m in length.

SUMMARY OF THE INVENTION

Accordingly, an object of the present invention is to provide a method of preparing an oxide superconducting wire which can solve the aforementioned problems.

In order to solve the aforementioned technical problems, the present invention is characterized in that a sealable metal billet is employed. According to the present invention, such a metal billet is first filled up with raw material powder for an oxide superconductor. The raw material powder means a calcined powder or sintered powder. Then, the metal billet is degassed by evacuation. The metal billet is sealed by a method such as welding while being maintained in the degassed state. Hydrostatic extrusion is applied to the sealed metal billet, thereby elongating the same.

In the aforementioned degassing step, gases contained in the metal billet are removed with those among the particles of the raw material powder. Such a degassed metal billet is sealed to be maintained in the degassed state. Hydrostatic extrusion is applied to the sealed metal billet, thereby uniformly extruding the raw material powder and the metal billet which are composed with each other.

According to the present invention, therefore, it is possible to obtain a long oxide superconducting wire which has excellent characteristics uniformly along its overall length, with no inflation of the metallic coating provided by the metal billet during heat treatment for sintering the raw material powder for the oxide superconductor. With application of the present invention, it is possible to obtain a long oxide superconducting wire of at least 5 km, for example. Thus, the oxide superconducting wire obtained according to the present invention can be advantageously applied to a coil, a cable or the like.

The foregoing and the other objects, features, aspects and advantages of the present invention will become more apparent from the following detailed description of the present invention when taken in conjunction with the accompanying drawings.

DESCRIPTION OF THE PREFERRED EMBODIMENT

Figure 1:
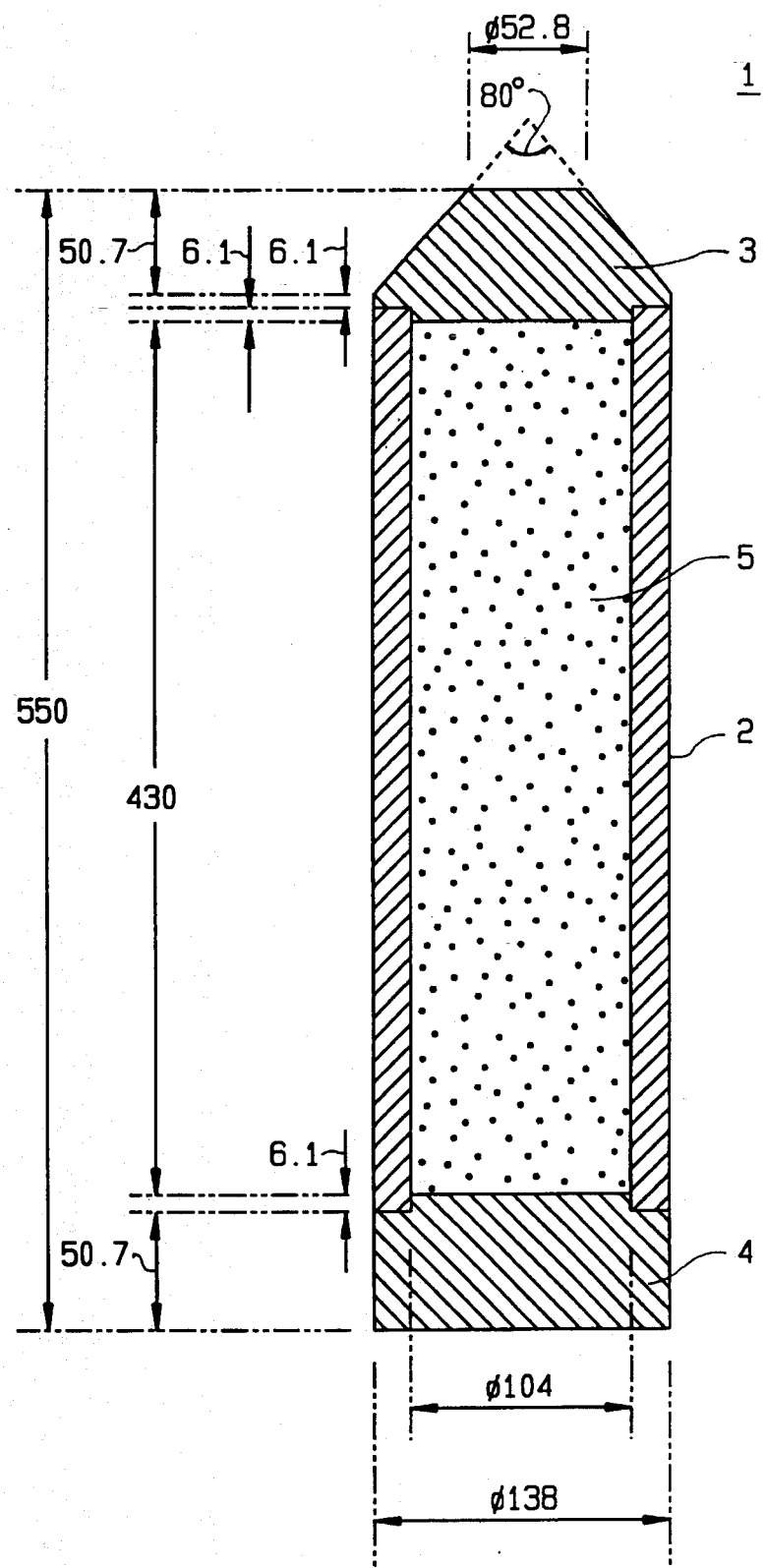
FIG. 1 is a sectional view showing a metal billet 1 which is employed in an embodiment of the present invention.

Referring to FIG. 1, the metal billet 1 is formed by a cylinder 2, an upper cover 3 and a bottom cover 4. The cylinder 2, the upper cover 3 and the bottom cover 4 have configurations to be engageable with each other. The metal billet 1 is preferably made of silver as a whole. Alternatively, only the inner surface of the metal billet 1 may be made of silver, and other portions may be made of another metal.

The cylinder 2 of such a metal billet 1 is filled up with raw material powder 5 for an oxide superconductor. The metal billet 1 thus filled up with the raw material powder 5 is evacuated under a high vacuum, so that gases contained therein are removed with those among the particles of the raw material powder 5.

Then, the upper cover 3, the bottom cover 4 and the cylinder 2 are subjected to electron beam welding, for example, while the metal billet 1 is maintained in the aforementioned degassed state. Thus, the metal billet 1 is sealed.

Then, hydrostatic extrusion is applied to the sealed metal billet 1. A temperature provided in such application of hydrostatic extrusion is preferably not more than 600° C. in order to prevent the raw material powder 5 from phase transformation. More preferably, the temperature is selected in a range between the room temperature and 400° C., which can minimize phase transformation, in consideration of heat generation in processing.

The wire obtained by such extrusion is further subjected to deformation processing such as wire drawing if necessary, and finally heat treated so that the raw material powder 5 contained in the metal billet 1 is sintered.

Example carried out according to the present invention is now described.

Oxides or carbonates were so mixed that Bi, Pb, Sr, Ca and Cu contained therein were in composition ratios of 1.79:0.43:1.99:2.22:3.00, and this mixture was heat treated to prepare powder consisting of 2212 phases, containing Bi+Pb, Sr, Ca and Cu substantially in ratios of 2:2:1:2, and non-superconducting phases.

This powder was degassed in a decompressed atmosphere of 10 Torr at 710° C. for 12 hours.

The as-obtained powder was filled up in the silver billet shown in FIG. 1. FIG. 1 shows the sizes (unit=mm) of the billet herein employed. The billet thus filled up with the powder was evacuated under a high vacuum, and brought into a sealed state by electron beam welding.

This billet was then extruded at room temperature into 60 mm in outer diameter by cold hydrostatic extrusion, and drawn into 1 mm in outer diameter with a drawing bench and a continuous drawing machine. Thereafter the billet was rolled into 0.17 mm in thickness, thereby obtaining a wire of 8 km in single length.

This wire was heat treated at 850° C. for 50 hours, then rolled into 0.15 mm in thickness, and again heat treated at 850° C. for 50 hours.

The as-formed oxide superconducting wire exhibited an excellent critical current density of $10^4$ A/cm$^2$ along its overall length, at the liquid nitrogen temperature.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of preparing an oxide superconducting wire, comprising the steps of:

filling up a metal billet with raw material powder for an oxide superconductor;

degassing said metal billet;

sealing said degassed metal billet;

applying hydrostatic extrusion on said sealed metal billet;

deformation processing said extruded metal billet to elongate said extruded metal billet; and heat treating the extruded metal billet for sintering said raw material powder to form the oxide superconductor.

2. A method of preparing an oxide superconducting wire in accordance with claim 1, wherein at least the inner surface of said billet is made of silver.

3. A method of preparing an oxide superconducting wire in accordance with claim 2, wherein said metal billet is made of silver.

4. A method of preparing an oxide superconducting wire in accordance with claim 1, wherein said step of applying hydrostatic extrusion comprises a step of heating said metal billet at a temperature of not more than 600° C.

5. A method of preparing an oxide superconducting wire in accordance with claim 4, wherein said step of applying hydrostatic extrusion comprises a step of heating said metal billet at a temperarature in a range from about room temperature to about 400° C.

* * * * *